United States Patent
Jang et al.

(10) Patent No.: US 10,405,456 B2
(45) Date of Patent: Sep. 3, 2019

(54) OUTDOOR DISPLAY APPARATUS HAVING ENHANCED TEMPERATURE STABILITY

(71) Applicant: HYUNDAI IT CO., LTD., Seoul (KR)

(72) Inventors: Sang Hun Jang, Gimcheon-si (KR); Seung Wun Seo, Gumi-si (KR)

(73) Assignee: HYUNDAI IT CO., LTD., Seoul (KR)

( * ) Notice: Subject to any disclaimer, the term of this patent is extended or adjusted under 35 U.S.C. 154(b) by 0 days.

(21) Appl. No.: 16/028,211

(22) Filed: Jul. 5, 2018

(65) Prior Publication Data
US 2019/0159363 A1    May 23, 2019

(30) Foreign Application Priority Data
Nov. 22, 2017    (KR) .................. 10-2017-0156088

(51) Int. Cl.
H05K 7/20      (2006.01)
H05K 5/00      (2006.01)
G09F 9/30      (2006.01)

(52) U.S. Cl.
CPC .......... *H05K 7/20209* (2013.01); *G09F 9/30* (2013.01); *H05K 5/0017* (2013.01); *H05K 7/20972* (2013.01)

(58) Field of Classification Search
None
See application file for complete search history.

(56) References Cited

U.S. PATENT DOCUMENTS

| | | | | |
|---|---|---|---|---|
| 5,869,919 A * | 2/1999 | Sato | ...................... | H01J 29/006 313/17 |
| 7,157,850 B2 * | 1/2007 | Miyazaki | ............. | G09G 3/2011 313/292 |
| 7,995,342 B2 * | 8/2011 | Nakamichi | ....... | G02F 1/133308 361/695 |
| 8,035,968 B2 * | 10/2011 | Kwon | ................ | H05K 7/20972 165/104.33 |

(Continued)

FOREIGN PATENT DOCUMENTS

KR    101153351 B1    6/2012
KR    10-1161370 B     7/2012

OTHER PUBLICATIONS

Korean Office Action dated May 1, 2019 in connection with counterpart Korean Patent Application No. 10-2017-0156088, citing the above reference.

*Primary Examiner* — Courtney L Smith
(74) *Attorney, Agent, or Firm* — Hauptman Ham, LLP

(57) ABSTRACT

An outdoor display apparatus having enhanced temperature stability comprises: a display panel having a driver board; a rear bracket having at least one opening for air circulation that is coupled to the display panel having the driver board; and a housing for accommodating a rear bracket coupled to the display panel, wherein: the inlet is formed at a lower portion of a rear surface of the housing, the outlet is formed at an upper portion of a rear surface of the housing, and air flows through a first clearance space existing between the front surface of the display panel and the transparent optical member, a second clearance space existing between the rear (Continued)

surface of the display panel and the rear bracket having the opening for air circulation, and a third clearance space existing between the rear bracket having the opening for air circulation and the housing.

7 Claims, 10 Drawing Sheets

(56) References Cited

U.S. PATENT DOCUMENTS

| | | | | |
|---|---|---|---|---|
| 8,248,784 | B2* | 8/2012 | Nakamichi | H05K 7/20972 |
| | | | | 361/679.46 |
| 9,835,893 | B2* | 12/2017 | Dunn | H05K 7/20154 |
| 9,894,800 | B2* | 2/2018 | Dunn | G02F 1/133385 |
| 10,165,712 | B1* | 12/2018 | Jang | H05K 7/20972 |
| 2009/0310059 | A1* | 12/2009 | Kim | G02F 1/133385 |
| | | | | 349/58 |
| 2011/0037937 | A1* | 2/2011 | Yang | G02F 1/133385 |
| | | | | 349/161 |
| 2016/0307477 | A1* | 10/2016 | Cox | G09F 27/008 |

* cited by examiner

OUTDOOR DISPLAY APPARATUS HAVING ENHANCED TEMPERATURE STABILITY

CROSS-REFERENCE TO RELATED APPLICATIONS

This application claims the benefit of Korean Patent Application No. 10-2017-0156088 filed with the Korean Intellectual Property Office on Nov. 22, 2017, the disclosures of which are incorporated herein by reference.

TECHNICAL FIELD

The present invention relates to an outdoor display apparatus having enhanced temperature stability. In the process of controlling the temperature inside the outdoor display apparatus of the present invention, the air circulates the main heat-generating parts inside the apparatus uniformly, so that the overall temperature distribution inside the apparatus can be kept constant, the time required for calibrating temperature inside the apparatus to a target value can be shortened, the operation time of the fan that induces the airflow can be reduced while allowing the temperature inside the apparatus to accurately reach the target value.

BACKGROUND

Generally, in the outdoor display apparatus which can be used for an outdoor advertising apparatus, the heat generated inside the apparatus and direct sunlight raise the temperature inside the apparatus and in the front panel of the display to cause malfunction and shorten the lifetime of the apparatus.

To solve such a problem, one of the conventional technologies in Korean Patent No. 10-1153351, which was published on Jun. 5, 2012, has adopted a method of forcibly cooling the heat by installing an air conditioner including a compressor at the lower part or the rear part of the display apparatus to cool the heat generated inside.

However, there is a problem in that a production cost increases due to an additional component such as an air conditioner to be provided inside the product, and the overall size of the product increases compared to the actual display portion.

(Prior Art 0001) Korean Patent No. 10-1153351 (Jun. 5, 2012)

SUMMARY

The present invention has been made in view of the above problems, and it is an object of the present invention to provide an apparatus and a method for controlling the temperature inside the display apparatus by evenly circulating the airflows through the main heat-generating parts inside the apparatus so that it can shorten the time required for calibration and reduce the operation time of the fan for inducing the air flow while allowing the temperature inside the apparatus to accurately reach the target value.

It is another object of the present invention to provide an outdoor display apparatus with enhanced temperature stability in order to prevent a malfunction and a shortening of life of the display apparatus by suppressing a rise in the temperature at both the front panel and the inside of the display panel due to self-generated interior heat and exterior heat caused by direct sunlight, reduce the difference between the external temperature and the inside temperature of the display apparatus to uniformly maintain the temperature inside the display apparatus.

It is another object of the present invention to enhance the temperature stability of an outdoor display apparatus by discharging heat inside the apparatus through an improved air flow path without providing an expensive and large-sized air conditioner inside the outdoor display apparatus, lowers the unit price of the display apparatus and provides a relatively compact product.

Technical Solution

According to some embodiment of the present invention, an outdoor display apparatus having enhanced temperature stability comprises a display panel having a driver board;

Advantageous Effects

According to the present invention, there is provided an apparatus and a method for controlling the temperature inside the display apparatus by evenly circulating the airflows through the main heat-generating parts inside the apparatus so that it can shorten the time required for calibration and reduce the operation time of the fan for inducing the air flow while allowing the temperature inside the apparatus to accurately reach the target value.

In addition, there is provided an outdoor display apparatus with enhanced temperature stability that can prevent a malfunction and a shortening of life of the display apparatus by suppressing a rise in the temperature at both the front panel and the inside of the display panel due to self-generated interior heat and exterior heat caused by direct sunlight, reduce the difference between the external temperature and the inside temperature of the display apparatus to uniformly maintain the temperature inside the display apparatus.

In addition, there is provided an outdoor display apparatus that can enhance the temperature stability by discharging heat inside the apparatus through an improved air flow path without providing an expensive and large-sized air conditioner inside the outdoor display apparatus, lowers the unit price of the display apparatus and provides a relatively compact product.

DESCRIPTION OF EMBODIMENTS

The specific structural or functional description of the embodiments of the present invention disclosed herein is merely illustrative for the purpose of illustrating embodiments of the present invention, and the present invention may be embodied in various forms and is not limited to the embodiments set forth herein. Additional advantages and modifications will readily occur to those skilled in the art. Therefore, the disclosure in its broader aspects is not limited to the specific details and representative embodiments shown and described herein. Accordingly, various modifications may be made without departing from the spirit or scope of the general inventive concept as defined by the appended claims and their equivalents.

Figure 1:
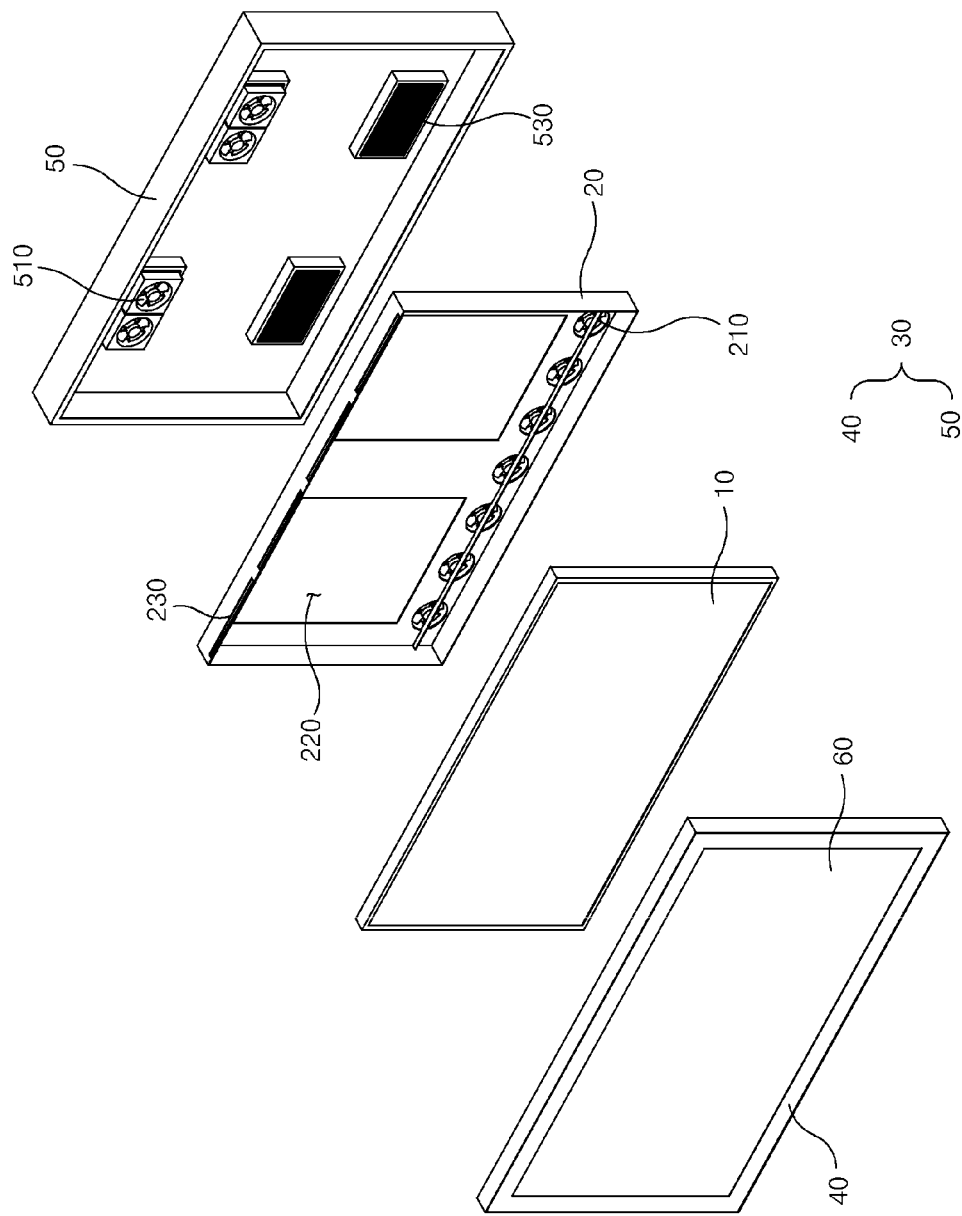
FIG. 1 is an exploded perspective view of an outdoor display apparatus with enhanced temperature stability according to some embodiment of the present invention.
Figure 2:
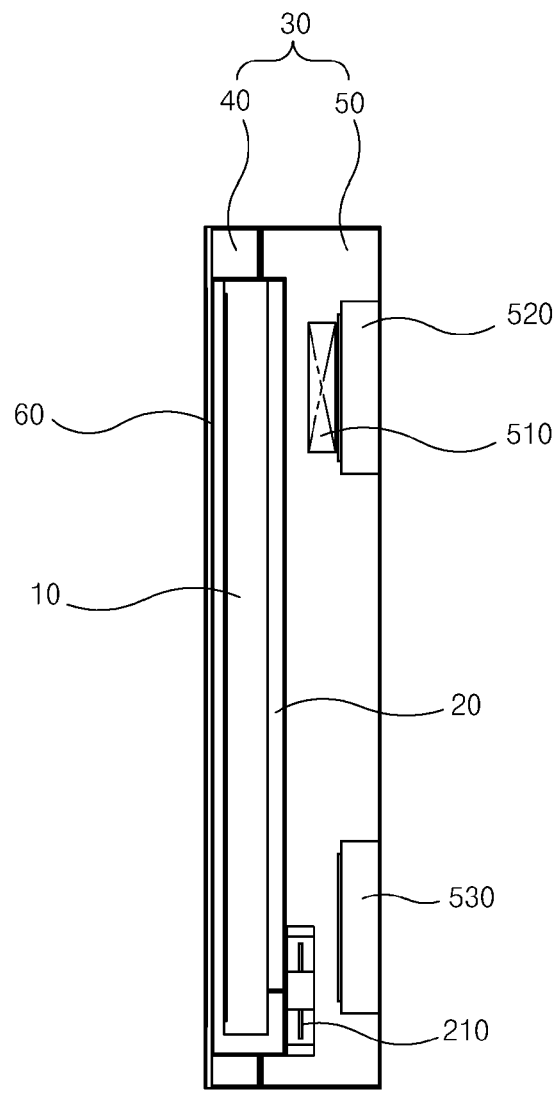
FIG. 2 is a cross-sectional view of the outdoor display apparatus having enhanced temperature stability according to the embodiment of the present invention.
Figure 5:
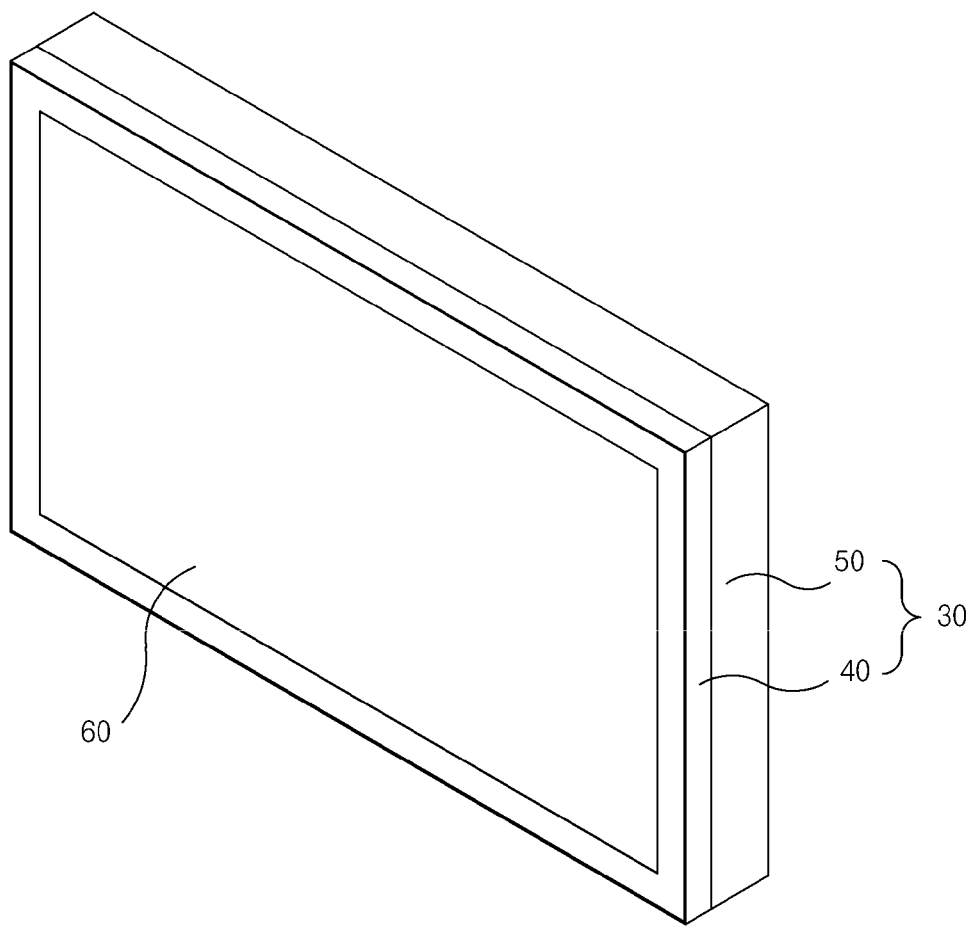
FIG. 5 is a view showing an exemplary shape of a housing included in the embodiment of the present invention.
Figure 6:
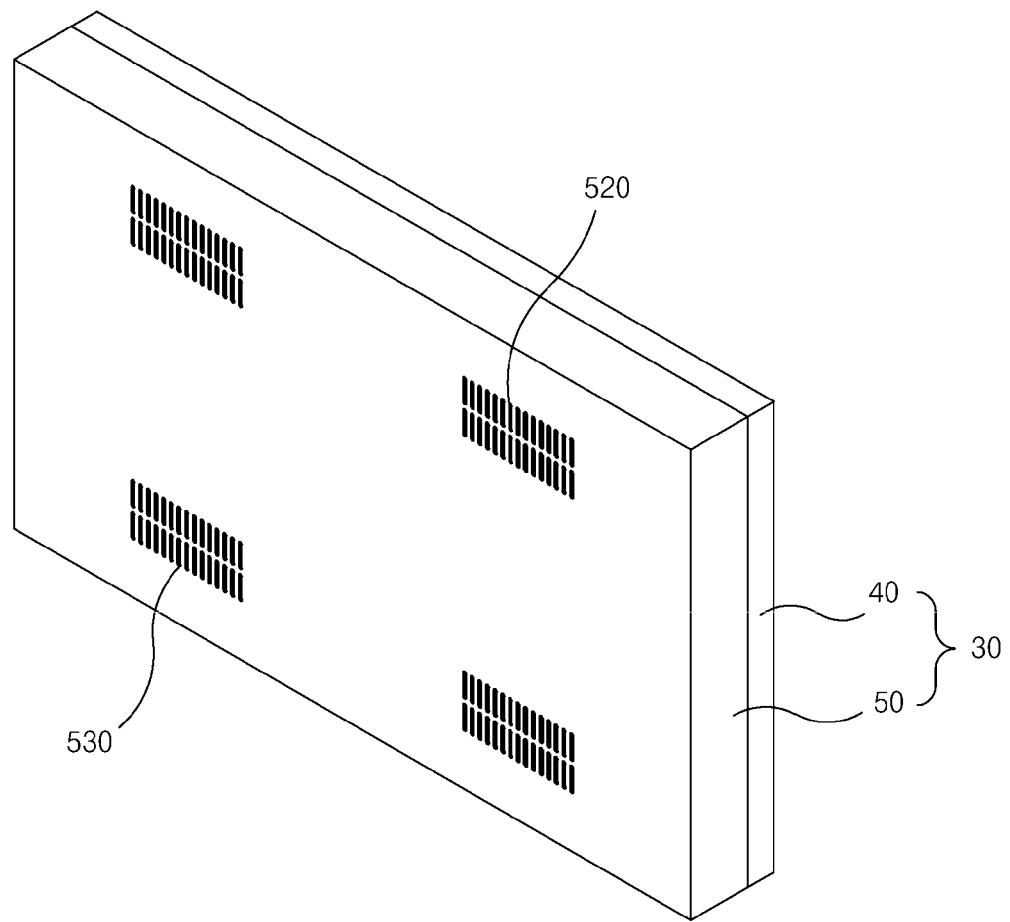
FIG. 6 is a view showing the inlets and outlets formed on the housing included in the embodiment of the present invention.
Figure 7:
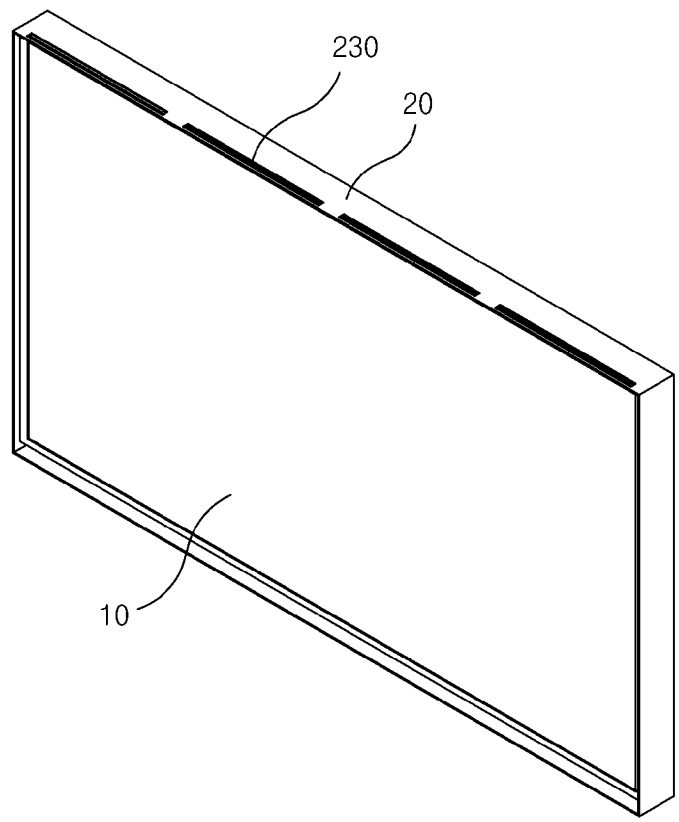
FIG. 7 is a view showing an exemplary front view of a combination of a display panel and a rear bracket included in the embodiment of the present invention.
Figure 8:
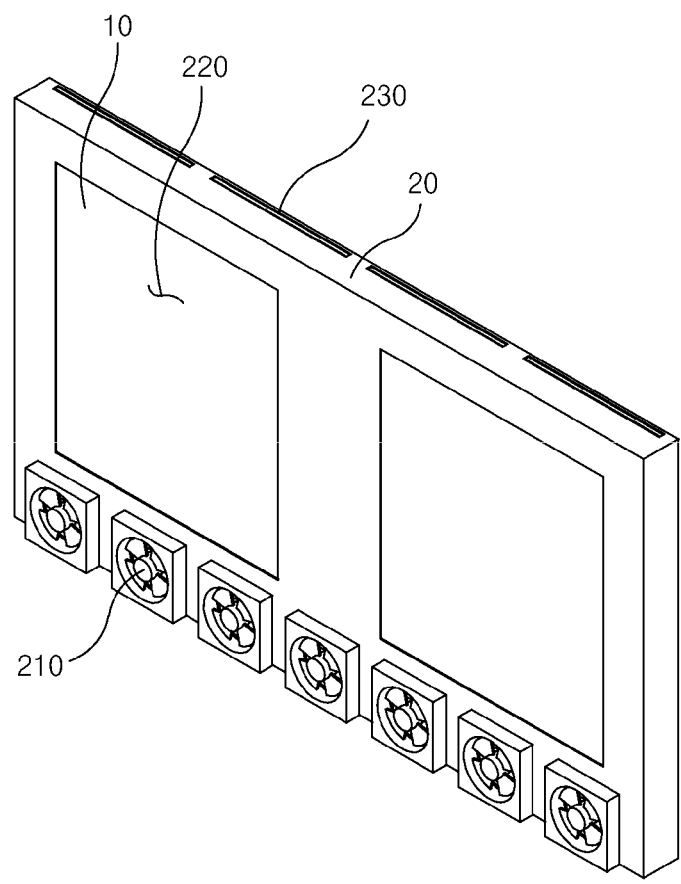
FIG. 8 is a view showing an exemplary rear view of a combination of a display panel and a rear bracket included in the embodiment of the present invention.
Figure 9:
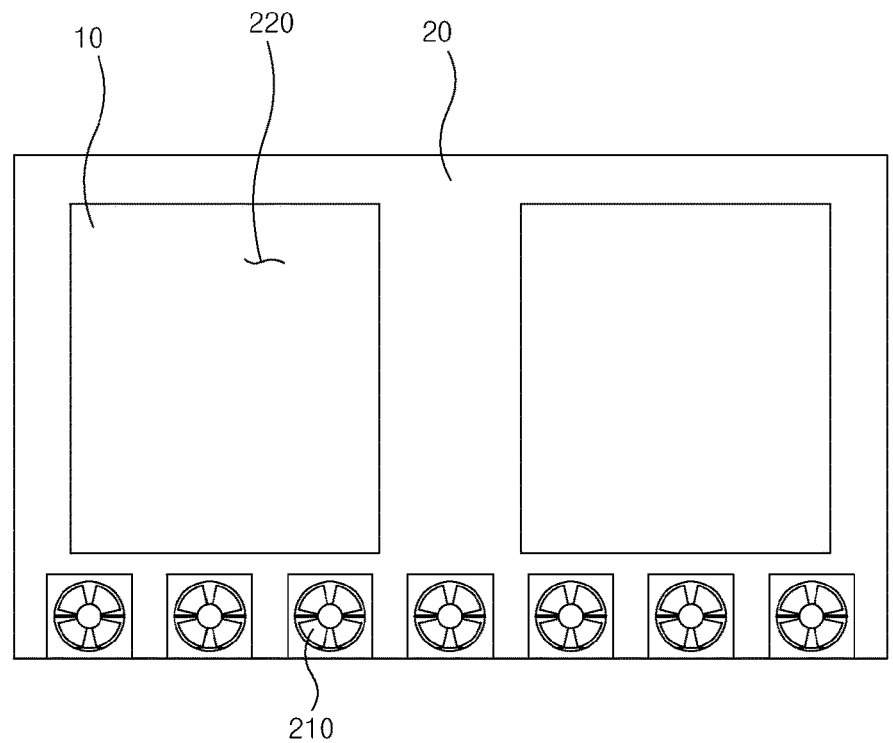
FIG. 9 is front view showing the combination of FIG. 8.
Figure 10:
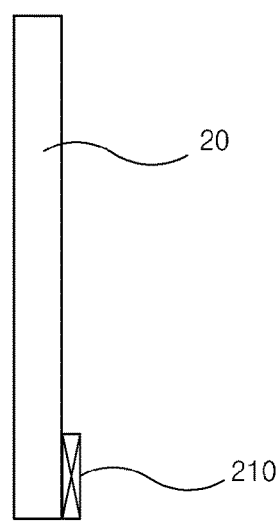
FIG. 10 is a side view showing the combination of FIG. 8.
Figure 11:
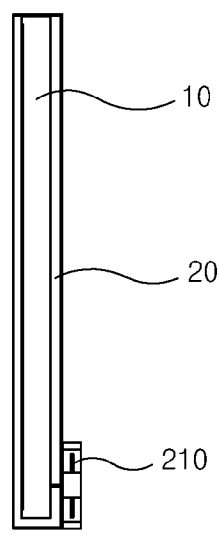
FIG. 11 is a cross-sectional side view showing the combination of FIG. 8.

FIG. 1 is an exploded perspective view of an outdoor display apparatus with enhanced temperature stability according to some embodiment of the present invention, FIG. 2 is a cross-sectional view of an assembled outdoor display apparatus with enhanced temperature stability according to the embodiment of the present invention, FIG. 5 is a view showing an exemplary shape of a housing, FIG. 6 is a view showing the inlets and outlets formed on the housing, FIG. 7 is a view showing an exemplary front view of the combination of the display panel and the rear bracket, FIG. 8 is a view showing an exemplary rear view of the combination of the display panel and the rear bracket, FIG. 9 is a front view, FIG. 10 is a side view and FIG. 11 is a cross-sectional sideview of the combination.

Referring to FIGS. 1, 2, and 5 to 11, an outdoor display apparatus with enhanced temperature stability according to an embodiment of the present invention includes a display panel 10, a rear bracket 20, a housing 30, and a transparent optical member 60.

Before describing the details of the components, the technical features of the present embodiment will be described.

The outdoor display apparatus with enhanced temperature stability according to the embodiment of the present invention stabilizes the internal temperature of the apparatus by inducing airflows through a first clearance space existing between the front surface of the display panel 10 and the transparent optical member 60, a second clearance space existing between the rear surface of the display panel 10 and the rear brackets 20 having openings 220, and a third clearance space existing between the rear bracket 20 and the housing 50. According to such a configuration, since the air circulates evenly through the main heating portion of the outdoor display apparatus the temperature inside the apparatus can be kept constant to greatly improve the temperature stability of the apparatus.

Hereinafter, detailed components for this configuration will be described.

The display panel 10 provides visual information to the user.

Since a considerable amount of heat is generated on the rear surface and the front surface of the display panel 10, cooling measures are required to cool down the generated heat.

Specifically, since various electronic devices 260 including a driver board for driving the display panel 10 and a set-top box, etc., are mounted on the rear surface of the display panel 10, which generates a considerable amount of heat during the operation, it is necessary to take measures against the generated heat.

In addition, the front surface of the display panel 10 is exposed to external light and emits heat by itself. That is, the front surface of the display panel 10 is exposed not only to the self-emitting heat but also to the external light reaching the front surface of the display panel 10 through the transparent optical member 60.

The rear bracket 20 is coupled to the display panel 10 on which the driver board is mounted and openings 220 are formed in the rear bracket 20.

For example, the opening 220 formed in the rear bracket 20 may be provided on at least both sides of the region where the driving board mounted on the display panel 10 is positioned to enhance the airflow between the second clearance space and the third clearance space.

For example, upper air holes 230 may be formed in the upper region of the rear bracket 20 coupled with the display panel 10 to induce airflow between the first clearance space and the third clearance space. The air holes 230 may have a stripe shape extending in the transverse direction of the rear bracket 20.

The housing 30 accommodates a rear bracket 20 coupled to the display panel 10, and a transparent optical member 60 positioned on the front surface of the display panel 10 is coupled to the front surface of the housing 30.

For example, the housing 30 may include a front housing 40 coupled with a transparent optical member 60 and a rear housing 50 having inlets 530 and outlets 520 formed therein.

Specifically, a lower portion of the rear surface of the housing 30, i.e., the lower portion of the rear housing 50 is formed with inlets 530 into which external air flows, and an upper portion of the rear surface of the housing 30, i.e., the upper portion of the rear housing 50 is formed with outlets 520 through which the internal air is exhausted. Filters for preventing the entrance of external dust, moisture, etc., may be provided in the inlet 530 and outlet 520.

The transparent optical member 60 coupled to the front surface of the display panel 10 functions to protect the display panel 10. The material of the transparent optical member 60 may be glass or the like, however, any material having transparency can be applied as the transparent optical member 60.

For example, the display panel 10 and the transparent optical member 60 may be configured to be bonded by optical contact bonding. Optical contact bonding is a method of inducing intermolecular bonding in the bonding surfaces to maintain a very firm bonding performance. When such optical contact bonding is applied, no adhesive or mechanical method is used for bonding the display panel 10 and the transparent optical member 60, so that deformation, displacement, and stress due to bonding are not caused. In addition, the bonding force is very high, the optical interface is eliminated, the bonding force is maintained for a long time, and the environmental characteristic is excellent.

Hereinafter, the detailed operation of the outdoor display apparatus with enhanced temperature stability according to the embodiment of the present invention will be described in a discharge mode and a circulation mode.

Figure 3:
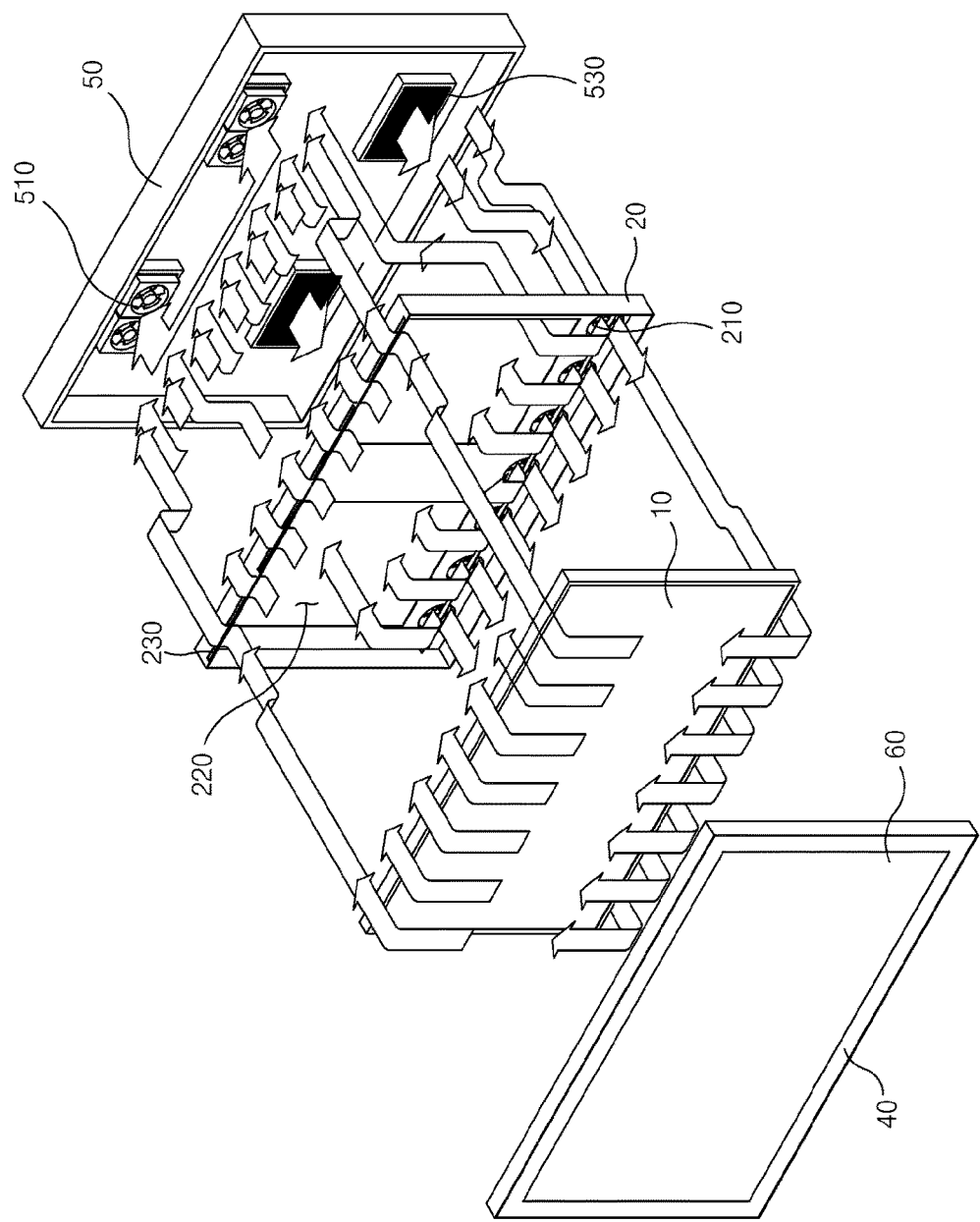
FIG. 3 is a view for explaining an air flow when an internal temperature rises in the outdoor display apparatus having enhanced temperature stability according to the embodiment of the present invention.

FIG. 3 is a view for explaining airflows when an internal temperature rises in an outdoor display apparatus with enhanced temperature stability according to the embodiment of the present invention.

In FIG. 3, airflows in a discharge mode or exhaust mode for discharging or exhausting the heat inside the apparatus to the outside is disclosed.

In the discharge mode, both the inlet fans 210 and the discharge fans 510 operate.

The inlet fans 210 are provided at a lower portion of the rear bracket 20 to correspond to the position of the inlets 530 formed in the rear housing 50. The outlet fans 510 are connected to the outlets 520 formed in the rear housing 50.

First, the air introduced through the inlet 530 by the operation of the inlet fan 210 is branched into the first clearance space and the second clearance space. The first clearance space is a space existing between the front surface of the display panel 10 and the transparent optical member 60 and the second clearance space is a space existing between the rear surface of the display panel 10 and the rear bracket 20.

The air bifurcated to the first clearance space rises to absorb the heat existing in the first clearance space, i.e., the space between the front surface of the display panel 10 and the transparent optical member 60. The air that absorbed the heat of the first clearance space is forced by the operation of the discharge fan 510 through the upper air holes 230 formed in the rear bracket 20 to the outlet 520 to be discharge to the outside.

The air bifurcated to the second clearance space rises and absorbs the heat existing in the second clearance space, i.e., the space between the rear surface of the display panel 10 and the rear bracket 20. The air that absorbed the heat of the second clearance space passes through the opening 220 formed in the rear bracket 20 and rises upward in the third clearance space between the rear bracket 20 and the rear housing 50 by the operation of the discharge fan 510, and absorbs the heat existing in the third clearance space. The air that absorbed heat in the third clearance space is induced to the outlets 520 by the operation of the discharge fan 510 and discharged to the outside.

The discharge mode is a configuration for keeping the internal temperature of the apparatus at an appropriate value by lowering the temperature when the temperature inside the apparatus rises above the appropriate range.

According to this configuration in the discharge mode, the air flowing into the main heating parts of the outdoor display apparatus, i.e., the first, the second and the third clearance spaces are uniformly circulated. Thus, the temperature distribution inside the apparatus is uniformly maintained, the time required to calibrate the temperature inside the apparatus to the target value is shortened, and the temperature inside the apparatus can be accurately reached to the target value while reducing the operation time of the inlet fan 210 and the discharge fan 510.

Figure 4:
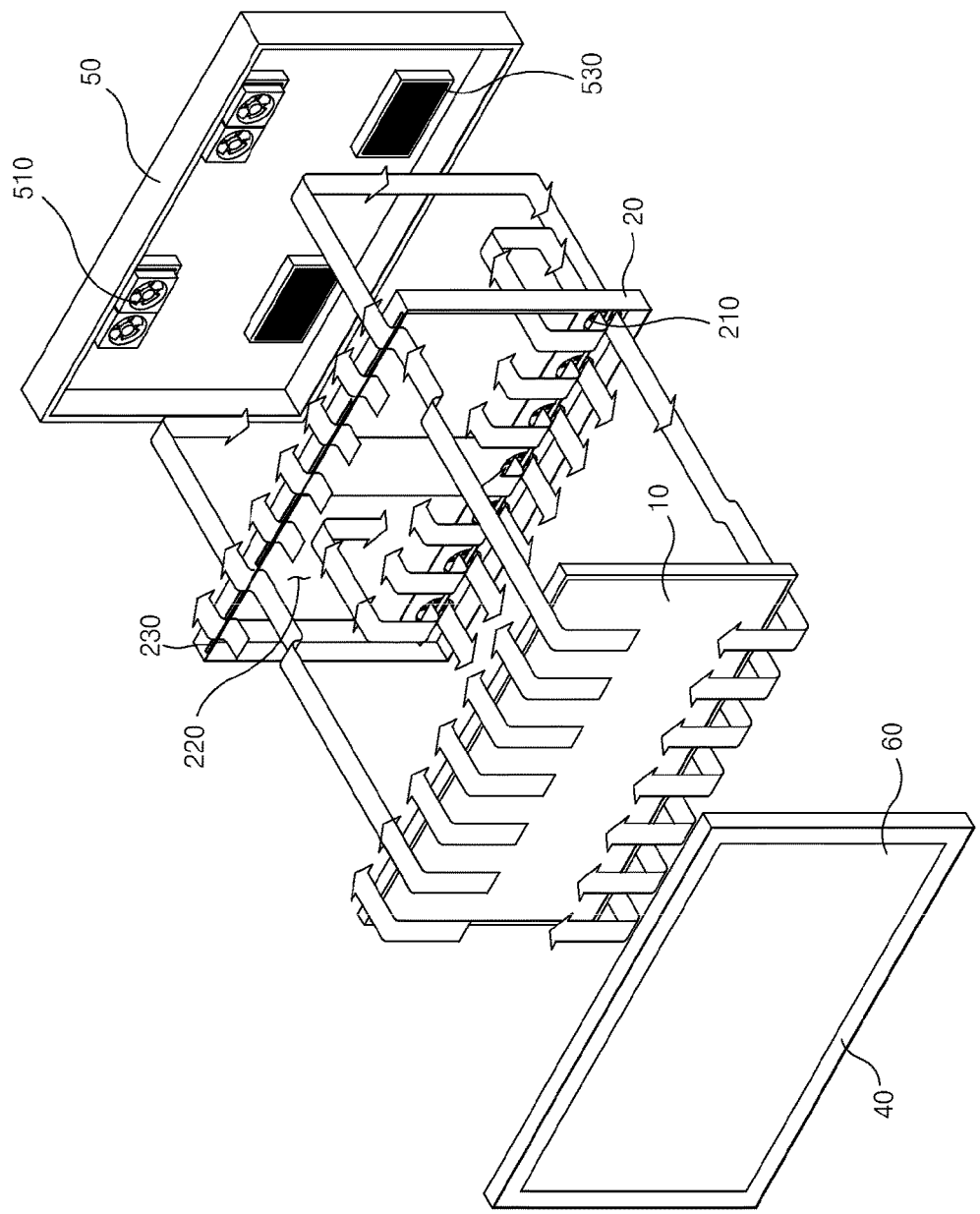
FIG. 4 is a view for explaining the air flow when the internal temperature is lowered in the outdoor display apparatus having enhanced temperature stability according to the embodiment of the present invention.

FIG. 4 is a view for explaining the airflows when the internal temperature is lowered in the outdoor display having enhanced temperature stability according to the embodiment of the present invention.

In FIG. 4, airflows in an internal circulation mode or a circulation mode for circulating heat inside the apparatus is disclosed.

In the circulation mode, the operation of the discharge fan 510 is stopped, and only the inlet fan 210 is operated.

First, by the operation of the inlet fan 210, the internal air is branched into the first clearance space and the second clearance space. The first clearance space is a space existing between the front surface of the display panel 10 and the transparent optical member 60 and the second clearance space is a space existing between the rear surface of the display panel 10 and the rear bracket 20.

The air that has branched to the first clearance space rises while absorbing the heat in the first clearance space. The air that absorbed the heat in the first clearance space is guided to the third clearance space through the upper air holes 230 formed in the rear bracket 20 by the operation of the inlet fan 210. The air induced into the third clearance space is lowered by the operation of the inlet fan 210 to absorb the heat existing in the third clearance space. Then, the air that absorbed the heat in the third clearance space passes through the inlet fan 210 by the operation of the inlet fan 210 and is re-branched to the first clearance space and the second clearance space.

The air bifurcated to the second clearance space rises and absorbs the heat existing in the second clearance space. The air that absorbed the heat of the second clearance space passes through the wide openings 220 formed in the rear bracket 20 and then descends in the third clearance space by the operation of the inlet fan 210 while absorbing the heat existing in the third clearance space between the rear bracket 20 and the rear housing 50. The air that absorbed the heat in the third clearance space is guided and re-branched into the first clearance space and the second clearance space.

The circulation mode is a configuration for raising the temperature when the temperature inside the apparatus falls below an appropriate value so that the internal temperature of the apparatus is maintained within an appropriate range.

According to such a configuration in the circulation mode, in the process of raising the overall internal temperature using heat generated inside the apparatus, heated airflows are circulated through and present in the all main heating parts of the outdoor display apparatus, that is, the first, the second and the third clearance spaces. Thus, the overall temperature distribution inside the apparatus becomes constant, the time required to calibrate the temperature inside the apparatus to the target value is shortened, and the operation time of the inlet fan 210 is reduced while maintaining the temperature to the target value accurately.

As described above in detail, according to the present invention, since the air circulates the main heat-generating parts inside the apparatus uniformly during the process of controlling the temperature inside the apparatus, the overall temperature distribution inside the apparatus can be kept constant, the time required to calibrate the temperature to the target value can be shortened and the operating time of the fan for controlling the air flow can be reduced while allowing the temperature inside the apparatus to reach the target value more accurately.

In addition, the outdoor display apparatus with enhanced temperature stability of the present invention can prevent a malfunction and a shortening of life of the display apparatus by suppressing a rise in the temperature at both the front panel and the inside of the display panel due to self-generated interior heat and exterior heat caused by direct sunlight, reduce the difference between the external temperature and the inside temperature of the display apparatus to uniformly maintain the temperature inside the display apparatus.

In addition, the outdoor display apparatus of the present invention can enhance the temperature stability by discharging heat inside the apparatus through an improved air flow path without providing an expensive and large-sized air conditioner inside the outdoor display apparatus, lower the unit price of the display apparatus and provide a relatively compact product.

The invention claimed is:

1. An outdoor display apparatus having enhanced temperature stability comprising:
   a display panel;
   a rear bracket having at least one opening for air circulation that is coupled to the display panel; and
   a housing for accommodating the rear bracket coupled to the display panel, being coupled to a transparent optical member disposed on a front surface of the display panel and having at least one inlet through which external air is introduced and at least one outlet through which internal air is discharged,
   wherein:
      the inlet is formed at a lower portion of a rear surface of the housing,
      the outlet is formed at an upper portion of a rear surface of the housing, and
      air flows through a first clearance space existing between the front surface of the display panel and the transparent optical member, a second clearance space existing between the rear surface of the display panel and the rear bracket having the opening for air circulation, and a third clearance space existing between the rear bracket having the opening for air circulation and the housing, and
   wherein, in a circulation mode for circulating internal heat,
      an inlet fan formed at a lower portion of the rear bracket to correspond to the inlet formed in the housing operates and a discharge fan formed at an upper portion of the rear bracket to correspond to the outlet formed in the housing stops its operation,
      the internal airflows are branched into the first clearance space and the second clearance space,
      the airflows branched into the first clearance space rise while absorbing the heat in the first clearance space and move to the third clearance space to descend while absorbing the heat in the third clearance space, and then re-branch into the first clearance space and the second clearance space, respectively, and
      the airflows branched into the second clearance space rise while absorbing the heat in the second clearance space and move through the opening formed in the rear bracket to descend in the third clearance space while absorbing heat in the third clearance space, and then re-branch into the first clearance space and the second clearance space, respectively.

2. The outdoor display apparatus according to claim 1, wherein:
   A in a discharge mode for discharging internal heat to the outside, the inlet fan and the discharge fan provided on the rear bracket operate, the inlet fan and outlet fan being corresponding to the inlet and outlet formed in the housing, respectively,
   the airflows introduced from the inlet are branched into the first clearance space and the second clearance space,
   the airflows branched into the first clearance space rise and absorb the heat existing in the first clearance space, and discharge to the outside through the outlet, and
   the airflows branched into the second clearance space rise and absorb the heat existing in the second clearance space and moves into the third clearance space through the opening, and then rises in the third clearance space while absorbing heat existing in the third clearance space to be discharged through the outlet.

3. The outdoor display apparatus according to claim 1, wherein:
   the at least one opening formed in the rear bracket is positioned to enhance the airflows between the second clearance space and the third clearance space.

4. The outdoor display apparatus according to claim 1, wherein:
   air holes are formed in the upper region of the rear bracket coupled with the display panel to induce airflows between the first clearance space and the third clearance space.

5. The outdoor display apparatus according to claim 4, wherein:
   the air holes are aligned to have a stripe shape extending in the transverse direction of the rear bracket.

6. The outdoor display apparatus according to claim 1, wherein:
   the display panel and the transparent optical member are bonded by optical contact bonding to each other.

7. The outdoor display apparatus according to claim 1, wherein:
   the housing comprises a front housing to which the transparent optical member is coupled and a rear housing in which the at least one inlet are formed in the lower portion and the outlet are formed in the its upper portion.

* * * * *